US006944834B2

(12) United States Patent
Posat et al.

(10) Patent No.: US 6,944,834 B2
(45) Date of Patent: Sep. 13, 2005

(54) METHOD AND APPARATUS FOR MODELING DYNAMIC SYSTEMS

(75) Inventors: Baris Posat, San Jose, CA (US);
Kemal Ozanoglu, Palo Alto, CA (US);
Alessandro Venca, San Jose, CA (US)

(73) Assignee: STMicroelectrontronics, Inc.,
Carrollton, TX (US)

( * ) Notice: Subject to any disclaimer, the term of this patent is extended or adjusted under 35 U.S.C. 154(b) by 291 days.

(21) Appl. No.: 10/349,540

(22) Filed: Jan. 22, 2003

(65) Prior Publication Data

US 2004/0143800 A1 Jul. 22, 2004

(51) Int. Cl.[7] .............................................. G06F 17/50
(52) U.S. Cl. .................................. 716/1; 716/4; 716/18
(58) Field of Search .......................... 716/1, 4–5, 18, 716/3; 703/2, 4, 13–14

(56) References Cited

U.S. PATENT DOCUMENTS 5,467,291 A * 11/1995 Fan et al. ..................... 703/14
2002/0183990 A1 * 12/2002 Wasynczuk et al. ........... 703/2

OTHER PUBLICATIONS

F. G. Canavero, et al., "Behavioral modeling of digital devises via Black–Box Identification", Dip. Elettronica, Politecnico di Torino, Italy, date unknown.

R. Kashni, "State–Space Formulation of Linear Systems", www.diecon.com, date unknown.

B. De Schutter and B. De Moor, "The characteristic equation and minimal state space realization of SISO systems in the max algebra," 11th International Conference on Analysis and Optimization of Systems, vol. 199 of Lecture Notes in Control and Information Sciences, Springer–Verlag, pp. 273–282, 1994.

QMS on the Web, EViews 4, Estimation and Estimation Object, "State Space Estimation," software upgrade brochure/advertisement, http://www.eviews.com/eviews4/eviews4/new4.html, May 2002.

M.I.A. Cavalcante, "Fractional Bayes Factor for Gaussian Linear State Space Models," Universidade do Amazones—ICE, 69077–000 Manaus, Brasil, Mar. 26, 2001.

Appendix B, "Introduction to PSPICE," pp. 1063–1082, date unknown.

* cited by examiner

Primary Examiner—Stacy A. Whitmore
Assistant Examiner—Paul Dinh
(74) Attorney, Agent, or Firm—Lisa K. Jorgenson; Andre M. Szuwalski

(57) ABSTRACT

A method and system are disclosed for generating descriptions of circuits representative of the behavior of dynamic systems. A state space model representing a dynamic system may be used to generate an electronic circuit equivalent having operating characteristics equivalent to the operating characteristics of the dynamic system. The electronic circuit equivalent may be then described as a SPICE circuit description which is simulated to determine the time and frequency domain characteristics of the dynamic system.

35 Claims, 4 Drawing Sheets

FIG. 4

| | | | | | |
|---|---|---|---|---|---|
| G11 | 100 | 60(1) | 60(1) | 70 | $A_{11}C_{x1}$ |
| G12 | 100 | 60(1) | 60(2) | 70 | $A_{12}C_{x1}$ |
| | | | ⋮ | | |
| G1k | 100 | 60(1) | 60(k) | 70 | $A_{1k}C_{x1}$ |
| G1(k+1) | 100 | 60(1) | 200(1) | 70 | $B_{11}C_{x1}$ |
| | | | ⋮ | | |
| G1(k+m) | 100 | 60(1) | 200(m) | 70 | $B_{1m}C_{x1}$ |
| C1 | 60(1) | 70 | $C_{x1}$ | | |

⎫ 150

| | | | | | |
|---|---|---|---|---|---|
| G21 | 100 | 60(2) | 60(1) | 70 | $A_{21}C_{x2}$ |
| G22 | 100 | 60(2) | 60(2) | 70 | $A_{22}C_{x2}$ |
| | | | ⋮ | | |
| G2k | 100 | 60(2) | 60(k) | 70 | $A_{2k}C_{x2}$ |
| | | | ⋮ | | |
| G2(k+m) | 100 | 60(2) | 200(m) | 70 | $B_{2m}C_{x2}$ |
| C2 | 60(2) | 70 | $C_{x2}$ | | |

⎫ 160

⋮

| | | | |
|---|---|---|---|
| VU1 | 200(1) | 70 | <TYPE AND PARAMETERS> |
| VU2 | 200(2) | 70 | <TYPE AND PARAMETERS> |
| | ⋮ | | |
| VUM | 200(m) | 70 | <TYPE AND PARAMETERS> |

⎫ 170

METHOD AND APPARATUS FOR MODELING DYNAMIC SYSTEMS

BACKGROUND OF THE INVENTION

1. Technical Field of the Invention

The present invention relates to modeling of systems and, more particularly, to forming SPICE equivalent circuits of dynamic systems represented by state space models.

2. Description of Related Art

Computer software simulation packages have been used in different applications and are mainly used to simulate and thereby determine the performance of systems. This enables a designer of the system to determine how a system works prior to actually building the system. Thus, design errors in the system may be discovered and corrected accordingly, before a system is manufactured. Several computer software simulation packages currently exist for simulating mechanical systems, aerodynamic systems, manufacturing and material processing systems, electrical systems, and many other systems. One of the most used computer software simulation packages is Simulation Program with Integrated Circuit Emphasis (SPICE).

SPICE is a computer software simulation package that is commonly used to simulate electronic circuits. A designer using a SPICE simulation tool can determine whether an electronic circuit performs according to the desired specification. In this way, simulation of the electronic circuit using SPICE enables the circuit designer to minimize design errors prior to the fabrication process. This reduction in design errors reduces expenses as errors uncovered in the prefabrication stage (design stage) are more easily corrected as opposed to errors detected after fabrication of the electronic circuit. In general, SPICE may be used to fine tune a circuit design and assure that the circuit performs according to the desired specification.

It is desirous to be able to simulate various systems that are not conventionally modeled using SPICE but are associated with electronic circuits to be designed. In view of the foregoing, a need for extending the capabilities of modeling and simulating systems using SPICE is desired, and particularly a need exists for quickly and easily constructing a SPICE model for various systems with which an electronic circuit may interact.

SUMMARY OF THE INVENTION

The present invention is directed to a method and system for generating SPICE circuit equivalent descriptions of dynamic systems represented by state space models. A state space model representing a dynamic system may be used to generate an electronic circuit equivalent having operating characteristics that are substantially equivalent to the operating characteristics of the dynamic system. The electronic circuit equivalent description may then be described as a SPICE circuit description to be simulated in SPICE. A SPICE simulation of the electronic circuit equivalent therefore indicates not only the operation of the electronic circuit equivalent but also the operation of the dynamic system.

The description of the electronic circuit equivalent may be created by mapping the coefficients of the state space model of the dynamic system into the description of the electronic circuit equivalent as components. The number of components in the electronic circuit equivalent and their interconnectivity are determined based upon the size of the state space model. The values of the components in the electronic circuit equivalent are determined based on the values of the coefficients of the state space model of the dynamic system. Resistors and capacitors in the electronic circuit equivalent, whose values are based on selected coefficients of the state space model, are determined and connected to voltage controlled current sources whose values are also determined based on the coefficients of the state space model. The specific use of resistors, capacitors and voltage controlled current sources enables the electronic circuit equivalent to have operating characteristics that are equivalent to the operating characteristics of the dynamic system. The description of the electronic circuit equivalent may then be described as a SPICE circuit description and simulated in SPICE.

In another exemplary embodiment, the SPICE circuit description may be directly created from the coefficients of the state space model of the dynamic system without initially generating a description of the electronic circuit equivalent.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 4 is a portion of a SPICE circuit description for the description of the electronic circuit equivalent of FIG. 3.

DETAILED DESCRIPTION OF THE PRESENT INVENTION

The numerous innovative teachings of the present application will be described with particular reference to the exemplary embodiments. However, it should be understood that the exemplary embodiments provide only a few examples of the many advantageous uses of the innovative teachings of the present invention.

The present invention is directed to creating a description of a dynamic system that may be simulated using SPICE. In general terms, a dynamic system may be represented mathematically by coupled differential equations that represent operating characteristics of the dynamic system. The coupled differential equations of the dynamic system typically include a number of coefficients. The coefficients of the coupled differential equations, according to an exemplary embodiment of the present invention, may be used to formulate a description of an electronic circuit equivalent that has operating characteristics that are substantially the same as the operating characteristics of the dynamic system. This is done by applying a correspondence between the coefficients appearing in the coupled differential equations and the electronic components appearing in the description of the electronic circuit equivalent of the dynamic system. For each coefficient in the coupled differential equations of the dynamic system, there exists a corresponding component in the description of the electronic circuit equivalent. The description of the electronic circuit equivalent may be created and a SPICE circuit description may be formed therefrom.

Figure 1:
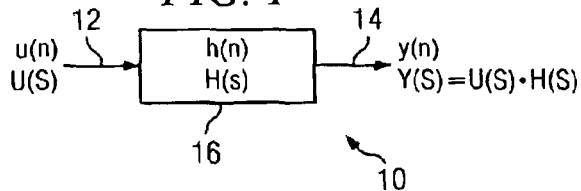
FIG. 1 illustrates a transfer function of an exemplary system.

Referring to FIG. 1, there is illustrated an exemplary system 10 to be modeled, having an input 12, an output 14 and a transfer function 16. As well known in the art, analysis of the system 10 may be done using conventional frequency response functions or using state space modeling. Using the state space modeling approach, the stability, controllability, observability and many other useful attributes of a dynamic system can be calculated. To represent the dynamic system in the state space modeling scheme, the differential equation which represents the dynamic system is rearranged to form state space equations. The state space equations are also referred to as coupled differential equations.

It is understood that if the dynamic system is represented in the frequency domain using a frequency domain transfer function or s-domain transfer function, the inverse Fourier transform or the inverse Laplace transform may be used to transform the transfer function into a differential equation. This differential equation may then be rearranged to form the state space equations.

A dynamic system represented by a second order differential equation can be represented by a pair of coupled differential equations. Similarly, an nth order differential equation may be represented by n coupled differential equations forming the state space model, as is well known in the art.

The state space equations forming the state space model of the dynamic system include state variables x which are a set of variables that define the state of the dynamic system, as well known in the art. Moreover, the knowledge of the state variables (also known as a state vector) along with the knowledge of the initial conditions may substantially determine the behavior of the dynamic system. The state space equations also include inputs u and outputs y of the dynamic system.

As described hereinbelow, state space models may be used to describe a special form of dynamic systems, linear time-invariant systems. State space equations of the state space model may be generally defined as shown in equations 1.

$$\frac{dx}{dt} = A \cdot x + B \cdot u \quad \text{(Eqs. 1)}$$
$$y = C \cdot x + D \cdot u$$

In this case, x is the state variable(s), u is the input(s) and y is the output(s). For linear time invariant systems, matrices A (the system matrix), B (the input matrix), C (the output matrix), and D (the connection matrix between the input and output matrices) are composed of constant, real number coefficients. However, it should be understood that coefficients of the matrices A, B, C, and D may be variables if the system is a linear time-variant system or may be of other forms for different types of systems.

The matrices A, B, C, and D are shown in detail in equations 2–5.

$$A = \begin{bmatrix} A_{11} & \cdots & A_{1k} \\ \vdots & \ddots & \vdots \\ A_{kl} & \cdots & A_{kk} \end{bmatrix} \quad \text{(Eq. 2)}$$

$$B = \begin{bmatrix} B_{11} & \cdots & B_{1m} \\ \vdots & \ddots & \vdots \\ B_{kl} & \cdots & B_{km} \end{bmatrix} \quad \text{(Eq. 3)}$$

$$C = \begin{bmatrix} C_{11} & \cdots & C_{1k} \\ \vdots & \ddots & \vdots \\ C_{nl} & \cdots & C_{nk} \end{bmatrix} \quad \text{(Eq. 4)}$$

$$D = \begin{bmatrix} D_{11} & \cdots & D_{1m} \\ \vdots & \ddots & \vdots \\ D_{nl} & \cdots & D_{nm} \end{bmatrix} \quad \text{(Eq. 5)}$$

Matrices A, B, C, and D have dimensions k×k, k×m, n×k, and n×m, respectively, wherein k is the number of states, m is the number of inputs and n is the number of outputs.

The coupled differential equations shown in equations 1 may be expanded by multiplying the matrices with the input u and state variables x to generate equations 6.

$$\frac{dx_1}{dt} = A_{11} \cdot x_1 + \ldots + A_{1k} \cdot x_k + B_{11} \cdot u_1 + \ldots + B_{1m} \cdot u_m \quad \text{(Eqs. 6)}$$
$$\frac{dx_2}{dt} = A_{21} \cdot x_1 + \ldots + A_{2k} \cdot x_k + B_{21} \cdot u_1 + \ldots + B_{2m} \cdot u_m$$
$$\vdots$$
$$\frac{dx_k}{dt} = A_{kl} \cdot x_1 + \ldots + A_{kk} \cdot x_k + B_{kl} \cdot u_1 + \ldots + B_{km} \cdot u_m$$
$$y_1 = C_{11} \cdot x_1 + \ldots + C_{1k} \cdot x_k + D_{11} \cdot u_1 + \ldots + D_{1m} \cdot u_m$$
$$y_2 = C_{21} \cdot x_1 + \ldots + C_{2k} \cdot x_k + D_{21} \cdot u_1 + \ldots + D_{2m} \cdot u_m$$
$$\vdots$$
$$y_n = C_{nl} \cdot x_1 + \ldots + C_{nk} \cdot x_k + D_{nl} \cdot u_1 + \ldots + D_{nm} \cdot u_m$$

In this case, coefficients $A_{xx}$ are the coefficients of matrix A (eq. 2), coefficients $B_{xx}$ are the coefficients of matrix B (eq. 3), coefficients $C_{xx}$ are the coefficients of matrix C (eq. 4), and coefficients $D_{xx}$ are the coefficients of matrix D (eq. 5). Equations 2–5, which may mathematically describe an exemplary linear time invariant system, will be used by embodiments of the present invention to create a description of an electronic circuit equivalent to the linear time invariant system.

Figure 2:
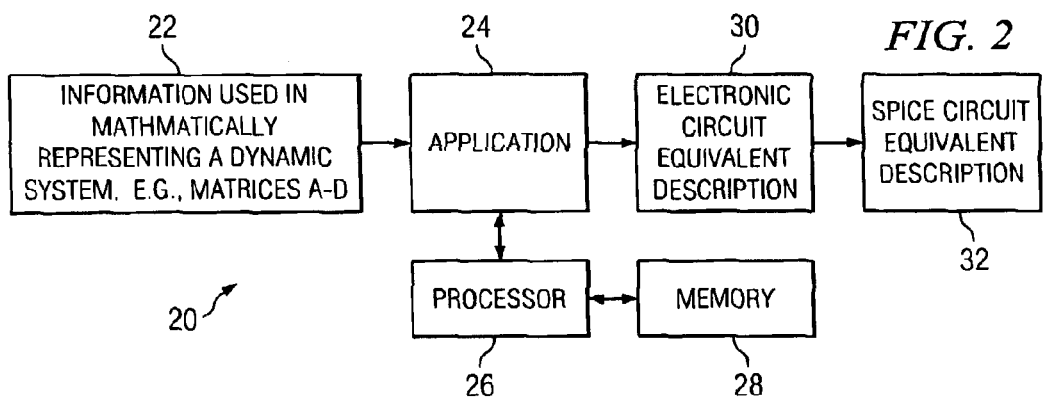
FIG. 2 illustrates a block diagram of a system according to an exemplary embodiment of the present invention.

Referring now to FIG. 2, there is illustrated a block diagram of an exemplary system 20, according to an exemplary embodiment of the present invention. The system 20 may generate a representation of the behavior of the dynamic system as a description of an electronic circuit equivalent 30 that can be subsequently converted into a SPICE circuit equivalent description 32 and/or netlist and simulated using SPICE. The system 20 may receive information used in mathematically representing the dynamic system from equations 2–5 (i.e., matrices A, B, C, and D), or equations 6. The mathematical representation of the dynamic system may be determined using MATLAB or any other simulation program that is capable of manipulating matrices. The matrix coefficients may be, for example, contained in a text file.

The system 20 may include an application 24 which may be run by a processor 26 in cooperation with memory 28 in which application 24 may be stored. In general, the application 24 receives the coefficients of matrices A–D of equations 2–5. Alternatively, application 24 may receive the matrix coefficients in other forms, such as by being provided with the coupled differential equations of the dynamic system (eqs. 6). It should also be understood that the coefficients may also be retrieved by the application 24. Knowing the size of each matrix A–D, application 24 may create an electronic circuit equivalent description 30 having a certain number of components corresponding to the number of coefficients within the matrices A–D, as will be described hereinbelow. The electronic circuit equivalent description 30 may be in the form of an electronic circuit schematic. The electronic circuit equivalent description 30 may then be used to create a SPICE circuit description 32. The SPICE circuit description 32 may then be simulated using SPICE to determine the operating characteristics of the electronic circuit equivalent which is substantially equivalent to the operating characteristics of the dynamic system.

Figure 3A:
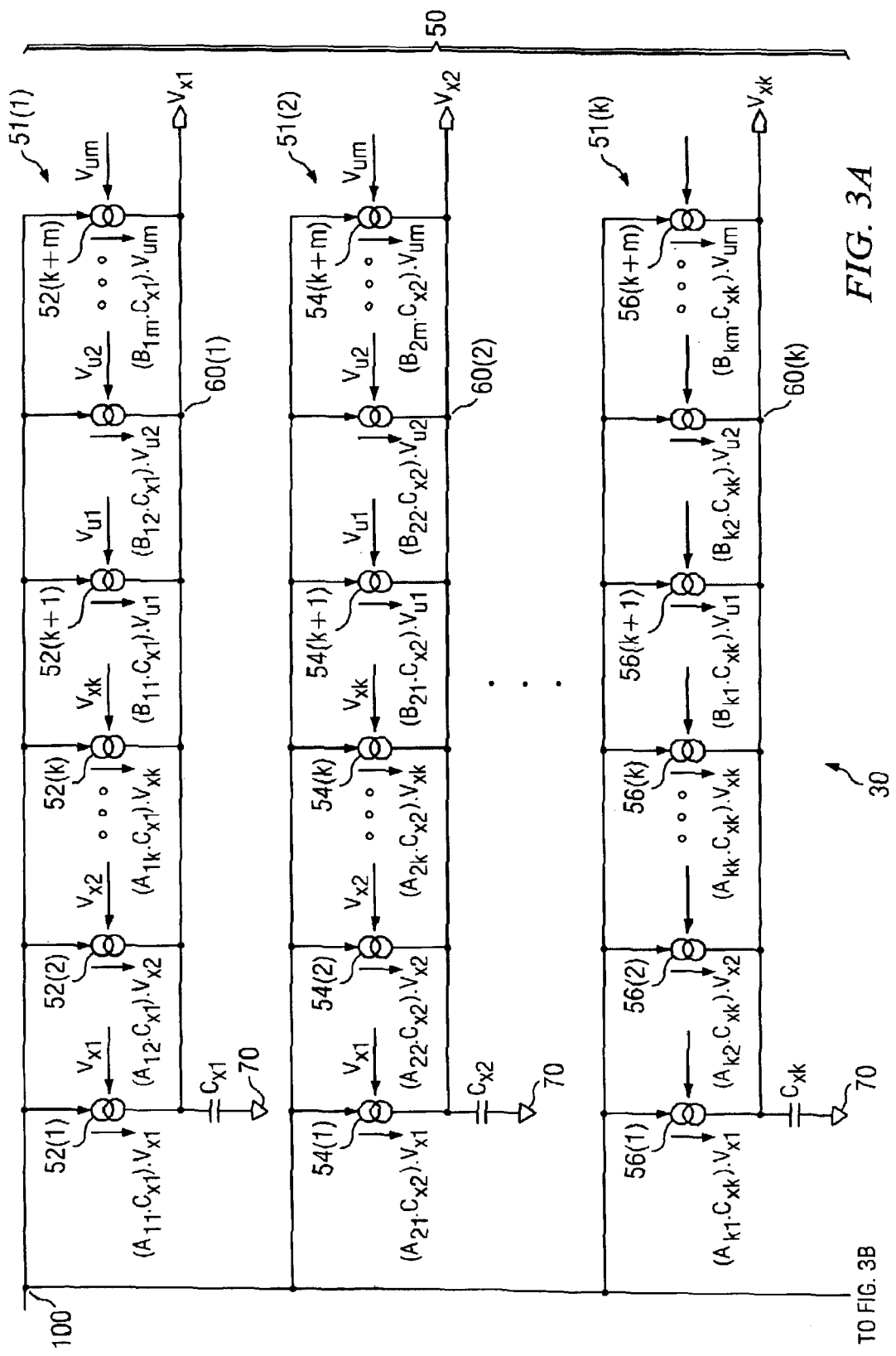
FIG. 3 illustrates a description of an electronic circuit equivalent of an exemplary dynamic system generated by an exemplary embodiment of the present invention.
Figure 3B:
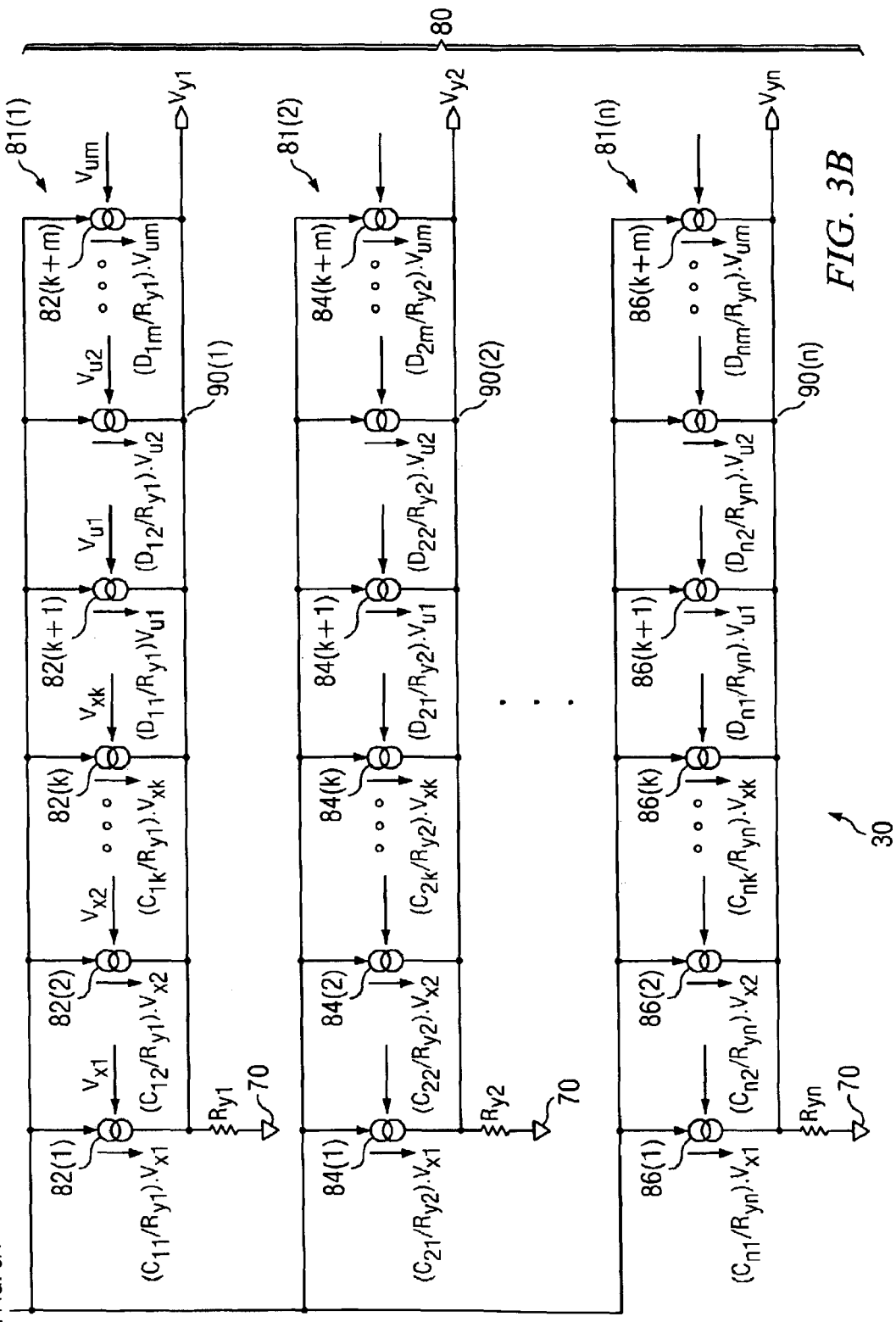

Referring now to FIG. 3, there is illustrated a description of an electronic circuit equivalent to an exemplary dynamic system, the electronic circuit equivalent being generated by an exemplary embodiment of the system 20 of the present invention. The electronic circuit equivalent description 30 in the exemplary embodiment is an electronic circuit schematic. The electronic circuit equivalent contains a plurality of circuits 51 and 81, each having a plurality of parallel-connected voltage controlled current sources (VCCSs). Each one of the circuits 51 and 81 has a passive component therein connected to the parallel-connected VCCSs. The passive component is a capacitor $C_{xi}$ for the circuits 51 in the top portion 50 of the electronic circuit equivalent and a resistor $R_{yi}$ for the circuits 81 in the bottom portion 80 of the electronic circuit equivalent.

As stated above, in each one of the circuits 51 and 81, the plurality of VCCSs are connected in parallel to each other. Considering the top portion 50 of the electronic circuit equivalent, the parallel-connected VCCSs in each one of the circuits 51 are connected between an originating node 100 and an associated common node 60 on which a voltage $V_{xi}$ appears thereon. Voltage $V_{xi}$ in each one of the circuits 51 is representative of a coefficient of a state variable $x_i$ of the state space model. In each circuit 51 in the top portion 50 of the electronic circuit equivalent, the capacitor $C_{xi}$ is connected at one end to the common node 60 and at the second end to ground 70. Regarding the bottom portion 80 of the electronic circuit equivalent, the parallel-connected VCCSs in each one of the circuits 81 are connected between originating node 100 and an associated common node 90 on which a voltage $V_{yi}$ appears thereon. Voltage $V_{yi}$ in each circuit 81 is representative of an output $Y_i$ of the state space model. In each circuit 81 in the bottom portion 80 of the electronic circuit equivalent, resistor $R_{yi}$ is connected at one end to the common node 90 and at a second end to ground 70.

The total number of VCCSs in the electronic circuit equivalent is equal to the total number of coefficients in the matrices A–D (equations 2–5) Each coefficient of the matrices A–D is mapped into a distinct VCCS in the description of the electronic circuit equivalent. The total number of circuits 51 in the top portion 50 of the electronic circuit equivalent (which is the same as the total number of capacitors $C_{xi}$) may be equal to the number of states k of the state space model of the dynamic system. The number of states k may be defined as the number of rows of the A matrix, which is also equal to the number of rows of the B matrix.

As described above, each capacitor $C_{xi}$ within each one of the k circuits 51 may be connected to a number of parallel-connected VCCSs 52, 54, or 56 at one end and to ground 70 at the other end, as shown in the top portion 50 of the electronic circuit equivalent. Each parallel-connected VCCS within each circuit 51 may be associated with a distinct coefficient of one of the matrices A and B. For example, VCCSs 52(1)–52(k) of circuit 51(1) are associated with the coefficients of the first row of matrix A coefficients of the first row of matrix B. Thus, the VCCSs in the circuits 51 have a one-to-one correspondence (mapped one-to-one) with the coefficients of matrices A and B. As can be seen, the total number of VCCSs, within each circuit 51 is the number of coefficients in the associated row of matrix A (k coefficients and/or states of the state space model) plus the total number of coefficients in the associated row of matrix B (m coefficients and/or inputs of the state space model), as shown in the electronic circuit equivalent of FIG. 3.

As described above, each one of the common nodes 60, which is a node connecting the VCCSs and the capacitors $C_{xi}$ in a circuit 51, has a voltage $V_{xi}$ appearing thereon representative of a coefficient of the state vector $x_i$ of the state space model. This voltage $V_{xi}$ appearing on each of the common nodes 60 of the circuits 51, along with values of selected coefficients of matrix A, may be used to control the value of the current generated by some of the VCCSs in circuits 51, as will be described hereinbelow. An input voltage $V_{ui}$ may be used along with values of selected coefficients of matrix B to control the value of the current generated by other of the VCCSs in circuits 51.

The total number of circuits 81 in the bottom portion 80 of the electronic circuit equivalent, which is the same as the total number of resistors $R_{yi}$ therein, may be equal to the number of outputs n of the state space model. The number of outputs may be the number of rows of the C matrix, which is the same as the number of rows of the D matrix. Similar to the capacitor $C_{xi}$ connections in circuits 51, each one of the n resistors $R_{yi}$ may be connected to a number of parallel-connected VCCSs 82, 84, or 86 at one end and to ground 70 at the other end, as shown in the bottom portion 80 of the electronic circuit equivalent. The number of parallel-connected VCCSs in each circuit 81 is equal to the sum of the number of columns of the C matrix and the number of columns of the D matrix combined. Each parallel-connected VCCS within each circuit 81 may be associated with a distinct coefficient in one of the matrices C and D. For example, VCCSs 82(1)–82(k) of circuit 81(1) are associated with the coefficients of the first row of matrix C and VCCSs 82(k+1)–82(k+m) are associated with the coefficients of the first row of matrix D. Thus, the VCCSs in the circuits 81 have a one-to-one correspondence (i.e., mapped one-to-one) with the coefficients of matrices C and D. Voltages $V_{yi}$ appearing on the common nodes 90 of the electronic circuit equivalent correspond to the values of the output y of the state space model of the dynamic system, as will be described hereinbelow.

The voltage $V_{xi}$ appearing on each of the common nodes 60 of the circuits 51 in the top portion 50 of the electronic circuit equivalent along with values of selected coefficients of matrix C, may be used to control the value of the currents generated by the VCCSs in the bottom portion 80 of the electronic circuit equivalent. In this case, the VCCSs are associated with the selected coefficients of matrix C. The input voltage $V_{ui}$ may be used along with values of selected coefficients of matrix D to control the value of the current generated by the VCCSs in the bottom portion 80 of the electronic circuit equivalent. In this case, the VCCSs are associated with the selected coefficients of matrix D. Thus, the VCCSs in the bottom portion 80 of the electronic circuit equivalent receive the same voltages $V_{xi}$ and $V_{ui}$ as the control voltages applied to the VCCSs in the top portion 50 of the electronic circuit equivalent in order to control the value of the current generated by the VCCSs. However, because each VCCS is associated with a distinct matrix coefficient, the amount of current provided by each VCCS may be different from the amount of current provided by other VCCSs.

The value of the components (VCCSs, capacitors, and resistors) may be determined from the values of the coefficients of the A–D matrices from the dynamic system. The value of each capacitor $C_{xi}$, according to an exemplary embodiment of the present invention, may be determined based on the maximum value of the coefficients of the associated row of matrices A and B as defined in equation 7.

$$C_{xi} = \frac{1}{\max(A_{i1}, \ldots, A_{ik}, B_{i1}, \ldots, B_{im})} \quad \text{(Eq. 7)}$$

In this case, the first capacitor $C_{x1}$ may be determined based upon the reciprocal of the coefficient in the first row of both matrices A and B having the largest value. The remaining capacitors $C_{x2}$ to $C_{xk}$ of the electronic circuit equivalent may be determined in a similar fashion using the other rows of matrices A and B (i.e., rows 2–k of matrices A and B).

Alternatively, the capacitors $C_{xi}$ in the electronic circuit equivalent may be chosen to be a different value. In another embodiment of the present invention, the capacitors $C_{xi}$ may be selected to have a value that is a multiple of ten. For example, the capacitors $C_{xi}$ may be selected to be 1 pF or any multiple of ten.

The value of each resistor $R_{yi}$, according to an exemplary embodiment of the present invention, may be determined based on the maximum value of the coefficients of the associated row of matrices C and D as defined in equation 8.

$$R_{yi} = \max(C_{i1}, \ldots, C_{ik}, D_{i1}, \ldots, D_{im}) \quad \text{(Eq. 8)}$$

In this case, the first resistor $R_{y1}$ may be determined based upon the value of the coefficient in the first row of matrix C and matrix D having the largest value. The remaining resistors $R_{y2}$ to $R_{yn}$ may be determined in a similar fashion using the other rows of matrices C and D (i.e., rows 2–n of matrices C and D).

Alternatively, the resistors $R_{yi}$ in the electronic circuit equivalent may be chosen to be a different value. In a preferred embodiment of the present invention, the resistors $R_{yi}$ may be selected to have a value of a multiple of ten. For example, the resistors $R_{yi}$ may be selected to be 1 kΩ or any multiple of ten.

The gain value of each VCCS in the circuits 51 in the top portion 50 of the electronic circuit equivalent is the value of the associated matrix coefficient ($A_{xx}$ or $B_{xx}$) multiplied by the value of the associated capacitor $C_{xi}$ to which the VCCS is connected. This calculated gain value is a constant gain multiplier that is multiplied by a control voltage $V_{xi}$ (appearing at a common node 60) or an input voltage $V_{ui}$ to be applied to the electronic circuit equivalent. For example, as shown in FIG. 3, each of the VCCSs 52(1)–52(k) has a gain value equal to the corresponding coefficient of matrix A (appearing in the first row of matrix A) multiplied by the capacitance value of the capacitor $C_{x1}$ to which the VCCS is connected. The voltages $V_{xi}$ are used as the control voltages for VCCSs 52(1)–52(k), respectively. The value of the current being generated by each of these VCCSs is equal to the gain thereof multiplied by the voltage $V_{xi}$ corresponding to the VCCS.

Each of the remaining VCCSs in the first row (i.e., VCCSs 52(k+1)–52(k+m)) has a gain value equal to the corresponding coefficient in the first row of matrix B multiplied by the value of the capacitor $C_{x1}$. The control voltages being applied to the VCCSs 52(k+1)–52(k+m) are the input voltages $V_{ui}$ to the electronic circuit equivalent. The value of the current being generated by each of these VCCSs is equal to the gain thereof multiplied by the input voltage $V_{ui}$ corresponding to the VCCS.

The gain value of each VCCS in the bottom portion 80 of the electronic circuit equivalent is the value of the associated matrix coefficient ($C_{xx}$ or $D_{xx}$) within the associated row of matrices C and/or D, divided by the value of the resistor $R_{yi}$ within the circuit 81 containing the VCCS. This gain value is a constant gain multiplier that is multiplied by the voltage $V_{xi}$ appearing at the common node 60 or an input voltage $V_{ui}$, similar to the top portion 50 described hereinabove.

For example, as shown in FIG. 3, the VCCSs 82(1) through 82(k) have gain values equal to the corresponding coefficients of matrix C divided by the value of the resistor $R_{y1}$ to which VCCS 82 is connected. The voltages $V_{xi}$ are used as the control voltage for VCCSs 82(1)–82(k). The value of the current generated by each of these VCCSs is equal to the gain multiplied by the corresponding voltage $V_{xi}$.

The remaining VCCSs in the first row (i.e., VCCSs 82(k+1)–82(k+m)) have gain values equal to the coefficients of the first row of matrix D divided by the value of the resistor $R_{y1}$. The control voltages applied to these VCCSs are the input voltages $V_{ui}$. The value of the current being generated by each these VCCSs is equal to the gain of the VCCS multiplied by the corresponding input voltage $V_{ui}$.

The electronic circuit equivalent shown in FIG. 3, having components with values as determined hereinabove, has operating characteristics that correspond to the operating characteristics of the dynamic system being modeled. The voltages $V_{xi}$ of the electronic circuit equivalent correspond to the state variables $x_i$ of the dynamic system. The input voltages $V_{ui}$ of the electronic circuit equivalent correspond to the inputs $u_i$ of the dynamic system. The output voltages $V_{yi}$ of the electronic circuit equivalent correspond to the outputs $y_i$ of the dynamic system. As can be seen, the current-voltage relationship for each capacitor $C_{xi}$ in the circuits 51 is $I = C \times dV_{xi}/dt$. Using Ohm's Law, the current passing through each capacitor $C_{xi}$ is the sum of the currents passing through the VCCSs connected to that capacitor $C_{xi}$. From this it can be shown that the capacitive current equations can be reduced to the $dx_i/dt$ equations of eqs. 6, where $x_i = V_{xi}$ and $u_i = V_{ui}$.

The current-voltage relationship for each resistor $R_{yi}$ in the circuits 81 is $I = V_{yi}/R_{yi}$. Using Ohm's Law, the current passing through each resistor $R_{yi}$ is the sum of the currents passing through the VCCSs connected to the resistor $R_{yi}$. From this relationship, it can be shown that the current equations relating to resistors $R_{yi}$ can be reduced to the $y_i$ equations of eqs. 6, where $x_i = V_{xi}$, $u_i = V_{ui}$, and $y_i = V_{yi}$.

FIG. 4 illustrates a portion of a SPICE circuit description of the exemplary electronic circuit equivalent of FIG. 3. The SPICE code portion 150 represents the description of the circuit 51(1). The SPICE code portion 160 represents the description of the circuit 51(2) of the electronic circuit equivalent. The voltage controlled current sources are the entries having names beginning with the letter "G". The entries having the names beginning with the letter "C" refer the capacitors $C_{xi}$. The second and third fields in each entry represent the node connections for the component. The fourth and fifth fields in each "G" entry define the control voltage for the VCCS. The sixth field represents the gain of the VCCS. It should be understood that the structure of the SPICE circuit description for other circuits 51(3)–51(k) and 81(1)–81(n) may be similar to the structure described above with respect to circuits 51(1) and 51(2).

The SPICE code portion 170 defines the inputs $V_{ui}$ of the system. The definition of the inputs $V_{ui}$ is provided by the designer/simulator of the dynamic system. In the SPICE description, the input voltages $V_{ui}$ are connected between nodes 200 and ground 70.

Figure 5:
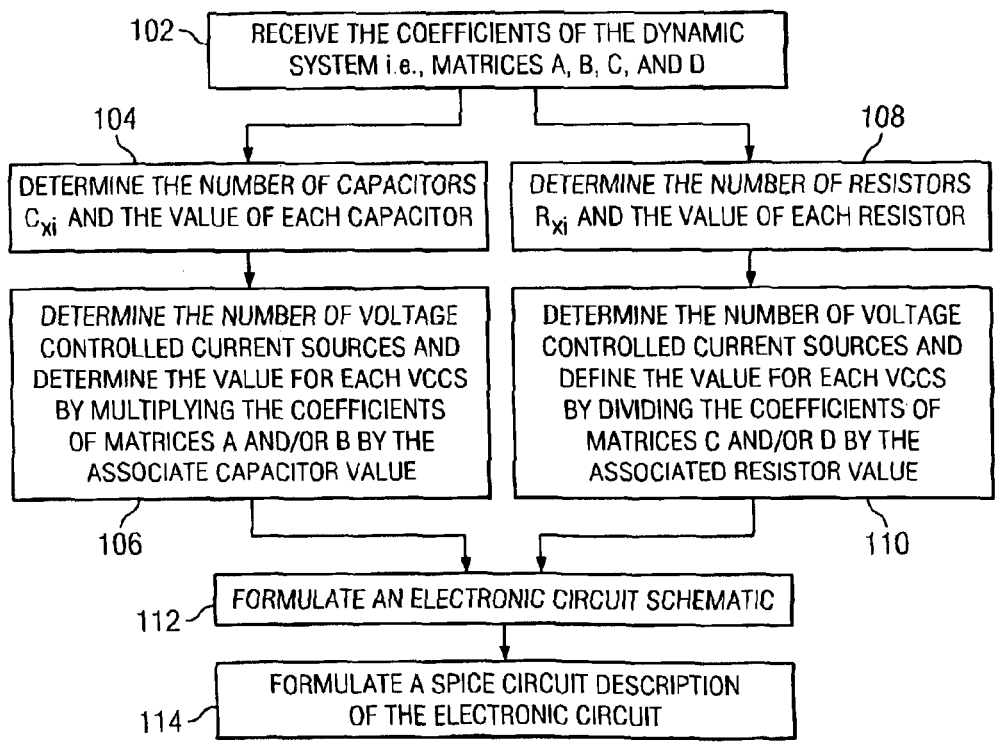
FIG. 5 illustrates a flow diagram of the operation of an exemplary embodiment of the present invention.

Referring now to FIG. 5, there is a flow diagram illustrating an operation of an exemplary embodiment of the present invention. The coefficients of the state space model of the dynamic system being modeled may be initially determined using any appropriate technique and loaded into a file or the like. The application 24, when executed, may then receive or retrieve the file (step 102). The application 24 may then define the number of capacitors $C_{xi}$ in the electronic circuit equivalent and the value of each capacitor $C_{xi}$ (step 104). As described above, the number of capacitors $C_{xi}$ is equal to the number of rows in matrix A and the value of each is determined using eq. 7. The application 24 may then determine the number of VCCSs 52, 54, and 56 connected to each capacitor $C_{xi}$ and determine the gain of each such VCCS (step 106). As described above, the number of VCCSs connected to each capacitor $C_{xi}$ is equal to the sum of number of columns of the A matrix and the number of columns of the B matrix. The gain of each VCCS may be equal to the value of the coefficient associated with the VCCS multiplied by the value of the capacitor $C_{xi}$ connected thereto. The number and values of the resistors are also determined (step 108). As described above, the number of resistors $R_{yi}$ is equal to the number of rows in matrix C and the value of each is determined using eq. 8. The application 24 also determines the number of VCCSs connected to each resistor $R_{yi}$ and determines the value of each VCCS (step 110). As described above, the number of VCCSs connected to each resistor $R_{yi}$ is equal to the sum of the number of columns of the C matrix and the number of columns in the D matrix. The gain value of each VCCS may be equal to the value of the coefficient associated with the VCCS multiplied by the value of the resistor capacitor $R_{yi}$ connected thereto.

At this point, the description of the electronic circuit equivalent may be formed (step 112). The description of the electronic circuit equivalent shown in FIG. 3 may be used to form a SPICE circuit description (step 114). The SPICE circuit description may be created by describing each electronic component of the electronic circuit equivalent as a SPICE instruction. Creating a SPICE circuit description from a schematic or netlist of an electronic circuit is well known in the art and will not be described in greater detail. The SPICE circuit description may then be simulated to determine both the time and frequency domain responses of the electronic circuit equivalent, which is representative of the behavior or response of the dynamic system. The result of the simulation may then be used in conjunction with SPICE circuit descriptions of other circuits to produce a simulation of a system having the dynamic system and other electronic circuits therein.

It should be understood that the approach described hereinabove is an exemplary embodiment of the present invention and other approaches for modeling a dynamic system as a SPICE circuit description are possible. In another exemplary embodiment of the present invention, once the number of components, the component values and the component connectivity of the circuit components are known from steps 104–110, the application 24 may directly create the SPICE circuit description without generating the schematic of the electronic circuit equivalent of FIG. 3. This may be performed by modifying a SPICE circuit description template based on the determinations in steps 104–110. For example, once the number of capacitors $C_{xi}$ and resistors $R_{yi}$ and their values are determined in steps 104 and 108, SPICE code entries for the capacitors $C_{xi}$ and resistors $R_{yi}$ may be automatically created in the SPICE circuit description. Similarly, after the VCCSs and their values are determined in steps 106 and 110, entries for the VCCSs in the SPICE circuit description are created.

In another exemplary embodiment of the present invention, the electronic circuit equivalent may be determined as discussed hereinabove with reference to FIG. 5 without generating the SPICE circuit description. The electronic circuit equivalent may then be used to create an alternate circuit description for simulation with other circuit simulator tools.

It is understood that the generated circuit description described above may be simulated using other commercially available circuit simulators, such as Spectre®, Eldo™ and PSpice.

Although exemplary embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A modeling system comprising:
   a processing element; and
   an application, when executed by the processing element, that causes the processing element to receive information used in mathematically representing a dynamic system and generate a description of an electronic circuit having operating characteristics representative of the operating characteristics of the dynamic system, wherein that electronic circuit comprises an input and a plurality of sub-circuits connected to that input, each sub-circuit comprising a plurality of voltage controlled current sources connected in parallel between the input and an output for the sub-circuit and a passive component connected between the sub-circuit output and ground.

2. The modeling system of claim 1, wherein said information used in mathematically representing the dynamic system comprises coefficients of a state space model of the dynamic system.

3. The modeling system of claim 1, wherein said description comprises a schematic of said electronic circuit.

4. The modeling system of claim 1, wherein the description comprises a SPICE circuit description.

5. The modeling system of claim 1, wherein the received information includes matrices having coefficients appearing in a state space model of the dynamic system, the coefficients being representative of the operating characteristics of the dynamic system, the voltage controlled current sources and passive components of said electronic circuit having component values and interconnectivity based on the coefficient.

6. The modeling system of claim 5, wherein the passive component of the sub-circuit comprises a capacitor having a value inversely proportional to selected ones of the coefficients of the matrices, a total number of the capacitors in the electronic circuit corresponding to a total number of rows within a selected one of the matrices.

7. The modeling system of claim 5, wherein the passive component of the sub-circuit comprises a resistor having a value proportional to selected ones of the coefficients of the matrices, a total number of resistors in the electronic circuit corresponding to a total number of rows within a selected one of the matrices.

8. The modeling system of claim 5, wherein the voltage controlled current sources have values associated with the coefficients of the matrices.

9. A modeling system comprising:
a processing element; and
an application, when executed by the processing element, causes the processing element to receive information used in mathematically representing a dynamic system and generate a description of an electronic circuit having operating characteristics representative of the operating characteristics of the dynamic system,
wherein the received information includes matrices having coefficients appearing in a state space model of the dynamic system, the coefficients being representative of the operating characteristics of the dynamic system, wherein said electronic circuit comprises
a plurality of capacitors;
a plurality of resistors; and
a plurality of voltage controlled current sources,
wherein each one of the capacitors and each one of the resistors is connected to a distinct set of voltage controlled current sources connected in parallel, values of the capacitors and the resistors, and the gain of the voltage controlled current sources are determined based on the values of the coefficients.

10. The modeling system of claim 1, wherein the number of voltage controlled current sources in each of the plurality of sub-circuits is equal to a sum of the total number of states of and the total number of inputs to the dynamic system.

11. The modeling system of claim 1, wherein the received information includes coefficients appearing in a state space model of the dynamic system, the coefficients being representative of the operating characteristics of the dynamic system, wherein each one of said voltage controlled, current sources has a value based on the value of a distinct coefficient.

12. The modeling system of claim 1, wherein the received information includes coefficients representative of the operating characteristics of the dynamic system, the total number of the plurality of circuits being equal to the sum of the total number of states and the total number of outputs of the dynamic system.

13. The modeling system of claim 1, wherein the passive component in each of a first group of the sub-circuits is a resistor and the passive component in each of a second group of the sub-circuits is a capacitor.

14. The modeling system of claim 1, wherein the dynamic system is a linear time invariant system.

15. A method for modeling the behavior of a dynamic system, comprising the steps of:
receiving information used in mathematically representing the dynamic system; and generating, based upon the received information, a description of electronic circuit representative of the behavior of the dynamic system, wherein that electronic circuit comprises an input and a plurality of sub-circuits connected to that input, each sub-circuit comprising a plurality of voltage controlled current sources connected in parallel between the input and an output for the sub-circuit and a passive component connected between the sub-circuit output and ground.

16. The method of claim 15, wherein said information used in mathematically representing the dynamic system comprises coefficients of state space equations of the dynamic system.

17. The method of claim 15, wherein said step of generating comprises the step of:
generating an electronic circuit schematic, the electronic circuit having operating characteristics substantially equivalent to operating characteristics of the dynamic system.

18. The method of claim 15, said information includes coefficients representative of the behavior of the dynamic system, wherein said step of generating further comprises the step of:
determining a number, type and interconnectivity of components of the electronic circuit to appear in the description of the electronic circuit based on the coefficients.

19. The method of claim 18, wherein the passive component in the electronic circuit is a capacitor, said step of generating further comprises the step of:
determining a value of each capacitor in the electronic circuit based on values of selected ones of the coefficients.

20. The method of claim 18, wherein the passive component in the electronic circuit is a resistor, said step of generating further comprises the step of:
determining a value of each resistor in the electronic circuit based on values of selected ones of the coefficients.

21. The method of claim 18, wherein said step of generating further comprises the step of:
determining a value of each voltage controlled current source based on a gain of a distinct one of the coefficients.

22. The method of claim 15, wherein said step of generating further comprises the steps of:
determining a number of capacitors for the passive components within the electronic circuit based on said information;
determining a number of resistors for the passive components within the electronic circuit based on said information; and
determining, for each capacitor and each resistor, a number of parallel-connected voltage controlled current sources connected thereto based on said information.

23. The method of claim 15, wherein said information comprises matrices having coefficients of a state space model of the dynamic system.

24. The method of claim 23, wherein:
said generating further comprises the step of mapping each one of the coefficients to a distinct voltage controlled current source in the electronic circuit so that a gain of each voltage controlled current source is proportional to the value of the corresponding coefficient to which the voltage controlled current source is mapped.

25. The method of claim 15, wherein the total number of sub-circuits is equal to the summation of the total number of states and the total number of outputs of the dynamic system.

26. The method of claim 15, wherein the dynamic system is a linear time invariant system.

27. A computer program product embodying program instructions for execution by a processor, the program instructions including instructions for:
receiving information used in mathematically representing the dynamic system; and
generating a description of an electronic circuit representative of the behavior of the dynamic system based upon the received information, wherein that electron circuit comprises an input and a plurality of sub-circuits connected to that input, each sub-circuit comprising a plurality of voltage controlled current sources connected in parallel between the input and an output for the sub-circuit and a passive component connected between the sub-circuit output and ground.

28. The computer program product of claim 27, wherein the description of the electronic circuit is a schematic.

29. The computer program product of claim 27, wherein said information used in mathematically representing the dynamic system comprises coefficients of state space equations of the dynamic system.

30. The computer program product of claim 27, wherein said information includes coefficients representative of the operating characteristics of the dynamic system, wherein said program instructions for generating further comprises program instructions for:

determining a number, type and interconnectivity of voltage controlled current sources and passive components of the electronic circuit to appear in the description of the electronic circuit, based on the coefficients.

31. The computer program product of claim 30, wherein:

said program instructions for generating comprises program instructions for mapping each one of the coefficients to a distinct voltage controlled current source in the electronic circuit so that a gain of each voltage controlled current source is proportional to the value of the corresponding coefficient to which the voltage controlled current source is mapped.

32. The computer program product of claim 30, wherein the passive component in the electronic circuit is a capacitor, wherein said program instructions for generating further comprises program instructions for:

determining a value of each capacitor in the electronic circuit based on values of selected ones of the coefficients.

33. The computer program product of claim 30, wherein the passive component in the electronic circuit is a resistor, wherein said program instructions for generating further comprises program instructions for:

determining a value of each resistor in the electronic circuit based on values of selected ones of the coefficients.

34. The computer program product of claim 30, wherein said program instructions for generating further comprises program instructions for:

determining a value of each voltage controlled current source based on a value of a distinct one of the coefficients.

35. The computer program product of claim 27, wherein said program instruction for generating further comprises program instructions for:

determining a number of capacitors for the passive components within the electronic circuit based on the received information;

determining a number of resistors for the passive components within the electronic circuit based on the received information; and determining, for each capacitor and each resistor, a number of parallel-connected voltage controlled current sources connected thereto based on the received information.

* * * * *

UNITED STATES PATENT AND TRADEMARK OFFICE
CERTIFICATE OF CORRECTION

PATENT NO. : 6,944,834 B2
APPLICATION NO. : 10/349540
DATED : September 13, 2005
INVENTOR(S) : Baris Posat et al.

It is certified that error appears in the above-identified patent and that said Letters Patent is hereby corrected as shown below:

| | |
|---|---|
| Column 5, line 49 | Replace "(equations 2-5) Each" With --(equations 2-5. Each-- |
| Column 5, line 66 | Replace "matrix A coefficients" With --matrix A and VCCSs 52 (k+1)-52(k+m) of circuit 51(1) are associated with the coefficients-- |
| Column 7, Equation 7 | Replace $$C_{xi} = \frac{1}{\max(A_{i1},...,A_{ik}, B_{i1},...,B_{im})}$$ With $$C_{xi} = \frac{1}{\max(A_{i1},...,A_{ik}, B_{i1},...,B_{im})}$$ |
| Column 7, Equation 8 | Replace $$R_{yi} = \max(C_{i1},...,C_{ik}, D_{i1},...,D_{im})$$ With $$R_{yi} = \max(C_{i1},...,C_{ik}, D_{i1},...,D_{im})$$ |

UNITED STATES PATENT AND TRADEMARK OFFICE
CERTIFICATE OF CORRECTION

PATENT NO. : 6,944,834 B2
APPLICATION NO. : 10/349540
DATED : September 13, 2005
INVENTOR(S) : Baris Posat et al.

It is certified that error appears in the above-identified patent and that said Letters Patent is hereby corrected as shown below:

| | |
|---|---|
| Column 8, line 9 | Replace "$V_{xi}$ appearing" With --$V_{xi}$, appearing-- |
| Column 10, lines 54-55, Claim 5 | Replace "coefficient." With --coefficients.-- |
| Column 10, line 59, Claim 6 | Replace "of the capacitors" With --of capacitors-- |
| Column 11, line 16 Claim 9 | Replace "comprises" With --comprises:-- |
| Column 12, line 67 Claim 27 | Replace "that electron" With --that electronic-- |

Signed and Sealed this

Seventeenth Day of October, 2006

JON W. DUDAS
*Director of the United States Patent and Trademark Office*